United States Patent
Kim et al.

(10) Patent No.: US 8,808,860 B2
(45) Date of Patent: Aug. 19, 2014

(54) 3-DIMENSIONAL NANOSTRUCTURE HAVING NANOMATERIALS STACKED ON GRAPHENE SUBSTRATE AND FABRICATION METHOD THEREOF

(75) Inventors: Sang Ouk Kim, Daejeon (KR); Won Jong Lee, Daejeon (KR); Duck Hyun Lee, Daejeon (KP); Tae Hee Han, Daejeon (KR); Ji Eun Kim, Daejeon (KR); Jin Ah Lee, Daejeon (KR); Keon Jae Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 13/322,385

(22) PCT Filed: Sep. 20, 2010

(86) PCT No.: PCT/KR2010/006461
§ 371 (c)(1),
(2), (4) Date: Jan. 20, 2012

(87) PCT Pub. No.: WO2011/037388
PCT Pub. Date: Mar. 31, 2011

(65) Prior Publication Data
US 2012/0121891 A1 May 17, 2012

(30) Foreign Application Priority Data
Sep. 24, 2009 (KR) .................. 10-2009-0090634

(51) Int. Cl.
*B32B 9/00* (2006.01)
(52) U.S. Cl.
USPC .......................... 428/408; 423/448
(58) Field of Classification Search
USPC ............. 428/408; 423/447.1, 447.2, 448; 977/742; 252/500
See application file for complete search history.

(56) References Cited

U.S. PATENT DOCUMENTS

| | | | |
|---|---|---|---|
| 2005/0176329 A1* | 8/2005 | Olry et al. | 442/388 |
| 2007/0284557 A1* | 12/2007 | Gruner et al. | 252/500 |
| 2008/0175984 A1 | 7/2008 | Yoon et al. | |
| 2009/0146111 A1* | 6/2009 | Shin et al. | 252/510 |
| 2009/0238996 A1 | 9/2009 | Nakano et al. | |

FOREIGN PATENT DOCUMENTS

| | | |
|---|---|---|
| KR | 10-2008-0012009 A | 2/2008 |
| KR | 10-2008-0103812 A | 11/2008 |
| KR | 10-2009-0019856 A | 2/2009 |

OTHER PUBLICATIONS

Masaaki Nagatsu et al., "Narrow multi-walled carbon nanotubes produced by chemical vapor deposition using grapheme layer encapsulated catalytic metal particles", Carbon, 2006, pp. 3336-3341, vol. 41.

(Continued)

*Primary Examiner* — Daniel H Miller
(74) *Attorney, Agent, or Firm* — Rabin & Berdo, P.C.

(57) ABSTRACT

The present invention relates to a 3-dimensional nanostructure having nanomaterials stacked on a graphene substrate; and more specifically, to a 3-dimensional nanostructure having at least one nanomaterial selected from nanotubes, nanowires, nanorods, nanoneedles and nanoparticles grown on a reduced graphene substrate. The present invention enables the achievement of a synergy effect of the 3-dimensional nanostructure hybridizing 1-dimensional nanomaterials and 2-dimensional graphene. The nanostructure according to the present invention is excellent in flexibility and elasticity, and can easily be transferred to any substrate having a non-planar surface. Also, all junctions in nanomaterials, a metal catalyst and a graphene film system form the ohmic electrical contact, which allows the nanostructure to easily be incorporated into a field-emitting device.

5 Claims, 4 Drawing Sheets

(56) References Cited

OTHER PUBLICATIONS

English Language Abstract of KR 10-2008-0012009 A.
English Language Abstract of KR 10-2008-0103812 A.
English Language Abstract of KR 10-2009-0019856 A.
International Search Report of PCT/KR2010/006461 mailed on Jun. 30, 2011.

* cited by examiner

3-DIMENSIONAL NANOSTRUCTURE HAVING NANOMATERIALS STACKED ON GRAPHENE SUBSTRATE AND FABRICATION METHOD THEREOF

TECHNICAL FIELD

The following disclosure relates to three-dimensional nanostructures composed of nanomaterials grown on a mechanically compliant graphene film. More particularly, the following disclosure relates to three-dimensional nanostructures composed of one or more nanomaterials selected from nanotubes, nanowires, nanorods, nanoneedles and nanoparticles, grown on a mechanically compliant reduced graphene film. The following disclosure also relates to a method for preparing the three-dimensional nanostructures.

BACKGROUND

In general, substrate materials used for the growth of nanomaterials are limited to brittle and flat insulating oxide materials, such as alumina ($Al_2O_3$) or silica ($SiO_2$). It is required that such substrates are stable at an adequately high temperature needed for the growth of nanomaterials; have mechanical compliance and flexibility so that they are transferred to a broad array in a basic structure (flexible polymer, non-planar structure); enable rapid and large-scale production of complicated device structures; and realize ohmic electrical contacts in all contacts in the case of electrically conductive materials, and have a work function similar to the work function of nanostructures so that electric power is used efficiently.

Herein, thin films may satisfy all of the above-described four requirements or at least three of them, when they are composed of nano-size platelets stacked successively and electrically insulating substrates are required. Transparent and electrically insulating thin films are also included in such thin films. Other examples for use in conductive plates include layered nanoclay (vermiculite, mica, montmorillonite, etc.) plates or layered hexagonal boron nitride (HBN) plates, and layered graphene-based plates having mechanical compliance.

Graphene means one layer of carbon with a hexagonal structure, and is a two-dimensional carbon structure having a thickness corresponding to one atom. In general, it is known that graphene is made of graphite found in pencils and has excellent physical properties as compared to carbon nanotubes.

Since nanomaterials, such as nanotubes, and graphene exhibit excellent conductivity and mechanical properties, have a large surface area and are very stable under non-oxidizing environment, they are useful as constituents forming nanoelectric devices including flexible devices. Therefore, there has been a need for developing hybrid technology to obtain a synergic effect by combining such excellent properties of the nanomaterials and graphene.

The inventors of the present invention have found that three-dimensional structures obtained by depositing a metallic catalyst array onto a graphene film and growing nanomaterials via a plasma enhanced chemical vapor deposition (PECVD) process, etc., have excellent conductivity and mechanical properties, such as flexibility and elasticity. The present invention is based on this finding.

SUMMARY

An embodiment of the present invention is directed to providing three-dimensional nanostructures composed of one or more nanomaterials grown on a mechanically compliant graphene film, and a method for preparing the same.

In one general aspect, there are provided three-dimensional nanostructures composed of one or more nanomaterials, selected from nanotubes, nanowires, nanorods, nanoneedles and nanoparticles, grown on a graphene film.

In another general aspect, there is provided a method for preparing three-dimensional nanostructures composed of one or more nanomaterials, selected from nanotubes, nanowires, nanorods, nanoneedles and nanoparticles, grown on a graphene film, the method including:

forming a graphene film on a substrate;

depositing a patterned metallic catalyst array onto the graphene film by using a block copolymer nanotemplate; and reducing the graphene film and allowing the nanomaterials to grow on the metallic catalyst, thereby providing three-dimensional nanostructures.

Other features and aspects will be apparent from the following detailed description and the claims.

BRIEF DESCRIPTION OF THE DRAWINGS

The above and other aspects, features and advantages of the disclosed exemplary embodiments will be more apparent from the following detailed description taken in conjunction with the accompanying drawings in which.

DETAILED DESCRIPTION OF EMBODIMENTS

Figure 1:
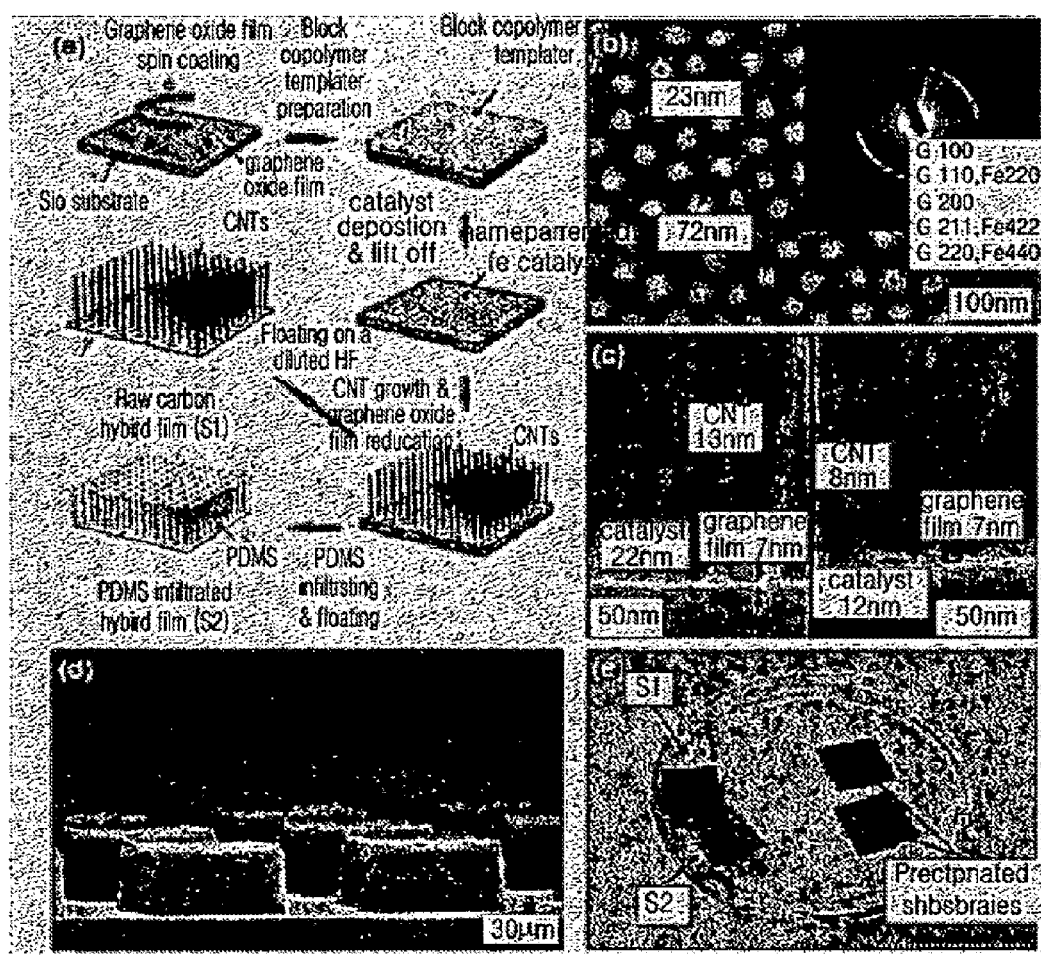
FIG. 1 shows, in portion (a), a schematic view illustrating the method for preparing three-dimensional nanostructures according to an embodiment, wherein S2 represents the three-dimensional nanostructures having polydimethylsiloxane (PDMS) infiltrated thereto and S1 represents the same having no PDMS infiltrated thereto; in portion (b), a scanning electron microscope (SEM) image of iron catalyst particles on a graphene film (the portion inserted at the top of the right side shows an electron diffraction pattern); in portion (c), a sectional view of the three-dimensional structures; in portion (d), a carbon nanotube array patterned into a square shape on a graphene film; and in portion (e), photographs of S1 and S2 floating on the water surface.

The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

In one aspect, there are provided three-dimensional nanostructures composed of one or more nanomaterials, selected from nanotubes, nanowires, nanorods, nanoneedles and nanoparticles, grown on a graphene film.

As used herein, graphene is a constituent of graphite and has a three-dimensional structure having a great number of interconnected carbon atoms stacked multiply in the form of hexagonal honeycombs. Graphene is a single sheet of the structure having a smallest thickness, and is a two-dimensional one-atom-thick planar thin film structure with a thickness of 0.35 nm. Graphene may conduct electric current in an amount about 100 times higher than copper (Cu) per unit area at room temperature, at a rate at least 100 times higher than silicon. In addition, graphene has a heat conductivity at least two times higher than diamond known as one of the highest heat conductive materials, as well as a mechanical strength at least 200 times higher than steel. Furthermore, graphene has good flexibility, and thus does not lose electrical conductivity even when stretched or folded. In other words, since graphene having a honeycomb structure formed by carbon atoms connected to each other like a network shows a space to spare in its honeycomb structure, it relatively well resists against a change in structure. In addition, due to the electron arrangement characteristics of the hexagonal carbon structure, it does not lose conductivity, and thus is chemically stable.

According to an embodiment, the graphene film that may be used herein is a mono-layer or multi-layer graphene plate or a film obtained by reducing a mono-layer or multi-layer graphene oxide plate. For example, a mono-layer or multi-layer graphene oxide plate obtained by spin coating an aqueous dispersion of graphite oxide may be reduced via a plasma enhanced chemical vapor deposition (PECVD) process. However, methods for reducing a graphene oxide plate are not limited thereto.

According to an embodiment, as the nanomaterials grown on the graphene film, the nanotubes have a quasi-one dimensional tubular structure, the nanowires have a structure like yarns and show a non-consistent growth direction, the nanorods have a straight structure, the nanoneedles have a growth direction but show a structure having sharp ends like needles, and nanoparticles are those having a size of 100 nm or less in at least one dimension.

According to an embodiment, the nanomaterials are aligned horizontally or vertically to the graphene film. In general, the nanotubes or nanowires may be prepared in a horizontally or vertically aligned form by CVD processes or hydrothermal methods through a vapor-liquid-solid (VLS) mechanism. The nanoparticles may be prepared in a horizontally or vertically aligned form by hydrothermal methods, metal ion reducing methods or other chemical methods. In other words, horizontal or vertical alignment may be realized depending on the particular type of nanomaterials and preparation methods, and the alignment methods that may be used herein are not limited to the above-mentioned methods.

According to an embodiment, a metallic catalyst is formed between the nanomaterials and the graphene film, wherein the metal may be selected from the group consisting of iron, nickel, copper, gold, platinum, palladium, cobalt and a combination thereof.

More particularly, after a block copolymer nanotemplate is formed on the graphene film, the metallic catalyst is deposited on the nanotemplate, and then the nanotemplate is removed to obtain a metallic catalyst array. Herein, the metallic catalyst array is formed in such a manner that the metallic catalyst particle size is controlled via heat treatment. This allows the nanomaterial array to grow closely in the horizontal or vertical direction. The metallic catalyst is obtained by forming a thin metal film on the substrate via a sputtering or vacuum deposition process, and allowing the metal particles to agglomerate at an elevated temperature for the purpose of the growth of the nanomaterials.

According to an embodiment, a polydimethylsiloxane (PDMS) elastomer is further infiltrated to the three-dimensional nanostructures in order to improve the mechanical properties and electrical conductivity as compared to the three-dimensional nanostructures alone.

According to an embodiment, the three-dimensional nanostructures realize ohmic electrical contacts. The term 'ohmic electrical contact' means a contact between a metal and a semiconductor in which current-voltage (I-V) characteristics follow the Ohm's Law. When a metal wire is drawn from a semiconductor device, it is required that the electrode metal and the semiconductor are in ohmic electrical contact having a low contact resistance value so as to prevent the electrode metal from affecting significantly the characteristics of the device. In other words, the I-V characteristics of the device depend on the difference in work functions between the two materials, and the ohmic electrical contact means a metal-semiconductor contact realizing linear I-V characteristics.

Therefore, the three-dimensional nanostructures composed of the graphene film-metallic catalyst-nanomaterials according to an embodiment realize ohmic electrical contacts at all contacts thereof, and thus may be easily incorporated to a filed emitting device.

In another aspect, there is provided a method for preparing three-dimensional nanostructures composed of one or more nanomaterials, selected from nanotubes, nanowires, nanorods, nanoneedles and nanoparticles, grown on a graphene film, the method including:

forming a graphene film on a substrate;

depositing a patterned metallic catalyst array onto the graphene film by using a block copolymer nanotemplate; and reducing the graphene film and allowing the nanomaterials to grow on the metallic catalyst, thereby providing three-dimensional nanostructures According to an embodiment, the substrate on which the graphene film is formed may be selected from the group consisting of silicon, ceramic and metals. Any substrates used currently in the related art may be used with no particular limitation.

According to an embodiment, the operation of forming a graphene film on a substrate may be carried out by using a spin coating process, but is not limited thereto. In addition, the graphene film may be a mono-layer or multi-layer graphene oxide plate, or a reduced mono-layer or multi-layer graphene oxide plate.

According to an embodiment, the operation of depositing a patterned metallic catalyst onto the graphene film may include:

forming a block copolymer nanotemplate on the graphene film;

depositing a metallic catalyst on the block copolymer nanotemplate; and removing the block copolymer nanotemplate to obtain a metallic catalyst array patterned on the graphene film.

More particularly, the deposition of the metallic catalyst array on the graphene film may be carried out as follows.

First, a self-assembled block copolymer nanotemplate is formed on the graphene oxide film. Next, the metallic catalyst particles are deposited on the surface of the graphene oxide film by using a vacuum deposition process, etc. For example, in the case of a nanotube array grown vertically in a high density, it is important to carry out an operation of forming the shape of a metallic catalyst via heat treatment. More specifically, a metallic catalyst is deposited on the block copolymer nanotemplate formed on the graphene film, and then the block copolymer nanotemplate is removed, for example, by using a toluene sonication process, to obtain a metallic catalyst array patterned in a nano-scale on the graphene film. Then, heat treatment is carried out at 550-650° C. to control the particle size of the metallic catalyst array. In this manner, it is possible to obtain metallic catalyst particles having a desired size.

Herein, the block copolymer nanotemplate may be obtained as follows. First, a block copolymer film is formed on the graphene film, and the block copolymer film is annealed at 160-250° C. to form a block copolymer having a cylindrical self-assembled nanostructure. Then, the block copolymer having a cylindrical self-assembled nanostructure is etched to remove the blocks forming the cylinders from the block copolymer.

When the block copolymer film is annealed, an annealing temperature lower than 160° C. may not allow self-assemblage of the block copolymer. On the other hand, an annealing temperature higher than 250° C. may cause degradation of the block copolymer. In addition, the operation of removing the blocks forming the cylinders may be carried out by using wet etching combined with UV radiation.

According to an embodiment, the block copolymer may be a binary block copolymer selected from the group consisting of polystyrene-block-poly(methyl methacrylate) (PS-b-PMMA), polystyrene-block-poly(ethylene oxide) (PS-b-PEO), polystyrene-block-poly(vinyl pyridine) (PS-b-PVP), polystyrene-block-poly(ethylene-alt-propylene) (PS-b-PEP) and polystyrene-block-polyisoprene (PS-b-PI).

According to an embodiment, the metallic catalyst is selected from the group consisting of iron, nickel, copper, gold, platinum, palladium, cobalt and a combination thereof. For the synthesis of the nanomaterials, such a metallic catalyst is obtained by forming a thin metal film on the substrate by using a sputtering or vacuum deposition process and allowing the metal atoms to agglomerate at an elevated temperature for the growth of the nanomaterials.

Herein, the material forming the substrate may have a low surface energy. In addition, it is required to protect the catalyst particles from being contaminated with the substrate material during the growth of the nanomaterials. Therefore, graphene having a low surface energy and high thermal stability is suitable as a substrate on which the nanomaterials are to be grown. For example, carbon nanotubes are generally grown on the graphene film at a rate of 20 μm/min and 100 μm/10 mins.

According to an embodiment, the operation of reducing the graphene film may be carried out by using a chemical vapor deposition (CVD) process but is not limited thereto. More particularly, the operation of reducing the graphene film may be carried out by using a PECVD process.

In general, for the growth of carbon nanotubes, vertically aligned carbon nanotubes may be prepared. It is also possible to use a low-temperature process, high-purity process and a large-area substrate process. In addition, a CVD process facilitating control of structures of carbon nanotubes is frequently used. Particularly, a PECVD process using plasma is used as an ideal method for growing carbon nanotubes, because it enables growth of carbon nanotubes at a lower temperature than a thermal chemical vapor deposition process and allows control of the direction of growing carbon nanotubes by using an electric field.

Herein, the PECVD process is carried out at 400-1000° C. When the heat treatment temperature is lower than 400° C., the graphene oxide film may not be reduced sufficiently. When the heat treatment temperature is higher than 1000° C., the graphene oxide film may not resist such a high temperature and thus may be decomposed.

According to an embodiment, water soluble colloidal suspension of a graphene oxide plate is deposited to obtain a large-area graphene film, which, in turn, is subjected to patterning with metallic catalyst particles. Then, a PECVD process is used to grow carbon nanotubes at a high rate, thereby providing the three-dimensional nanostructures. Herein, the graphene film is reduced into a conductive graphene-based film due to the processing temperature, thereby providing excellent electrical conductivity as well as mechanical compliance and optical transparency.

In the above-described embodiment, carbon nanotubes are grown to obtain the three-dimensional nanostructures. However, other methods for growing nanomaterials, such as nanowires, have been already known to those skilled in the art, and graphene having thermal and chemical stability does not adversely affect the growth of nanomaterials. Therefore, it will be easily appreciated by those skilled in the art that nanomaterials other than nanotubes may be grown on a graphene film to obtain a hybrid film.

According to an embodiment, the method may further include introducing a PDMS elastomer to the resultant hybrid film. When introducing a PDMS elastomer, it is possible to improve the mechanical properties, electrical conductivity, or the like, as compared to the hybrid film having no PDMS infiltrated thereto.

In the three-dimensional nanostructures disclosed herein, ohmic electrical contacts are realized among the graphene film, metallic catalyst and nanomaterials.

The three-dimensional nanostructures disclosed herein are stable even at high temperature, have mechanical compliance and allow easy size control through the direct deposition using commercially available colloidal suspension such as ink, so that they may be applied to a large-area device.

Therefore, the three-dimensional nanostructures obtained in the above-described manner may be applied to fabricate a very large scale of array on a thin and mechanically compliant film, or to carry out transfer onto a flexible or non-planar substrate. Further, in addition to the three-dimensional nanostructures using carbon nanotubes and graphene as described above, it is possible to obtain various types of three-dimensional nanostructures by growing other nanomaterials, such as nanowires, on a graphene film as a substrate.

Examples

The examples and experiments will now be described. The following examples and experiments are for illustrative purposes only and not intended to limit the scope of this disclosure.

Example 1

Preparation of Carbon Nanotubes-Graphene Three-Dimensional Nanostructures 1-1: Forming Graphene Oxide Film Portion (a) of FIG. 1 is a schematic view illustrating the method for preparing carbon nanotubes-graphene three-dimensional nanostructures. First, aqueous dispersion of oxidized graphite (i.e., containing suspended individual graphene oxide platelets) is subjected to spin coating on a silicon wafer to form a uniform graphene oxide film composed of graphene oxide platelets and having a thickness of about 7 nm.

1-2: Forming Block Copolymer Nanotemplate

Polystyrene-block-poly(methyl methacrylate) (PS-b-PMMA) is deposited on the graphite oxide film formed as described above to form a PS-b-PMMA film, which, in turn, is subjected to annealing at a temperature of 250° C. In this manner, a block copolymer having a vertical cylindrical self-assembled nanostructure is obtained. Then, PMMA (the block forming the vertical cylinders) is removed selectively via wet etching and UV radiation to obtain a PS nanotemplate having nanopores.

1-3: Depositing Metallic Catalyst Array

Fe, as a metallic catalyst, is deposited on the PS nanotemplate via a vacuum deposition process and toluene sonication is carried out to remove the PS nanotemplate. In this manner, a Fe array patterned hierarchically on the graphene film in multiple length scales is obtained.

Portion (b) of FIG. 1 is a SEM image illustrating the metallic catalyst particles having a uniform size and attached to the graphene film. It can be seen that the electron diffraction pattern of the catalyst particles taken by transmission electron microscopy (TEM) corresponds to Fe crystals with a face centered cubic (FCC) structure.

1-4: Growing Carbon Nanotubes through PECVD Process

The Fe array is subjected to a PECVD process at 600° C. under a total pressure of 5 Torr with flow of $C_2H_2/H_2/NH_3$ (5 sccm/80 sccm/20 sccm) to reduce the graphene oxide film and to allow growth of carbon nanotubes. In this manner, three-dimensional nanostructures including carbon nanotubes grown on the graphene film are obtained. In the nanostructures, the carbon nanotubes are doped with nitrogen and are metallic.

Figure 4:
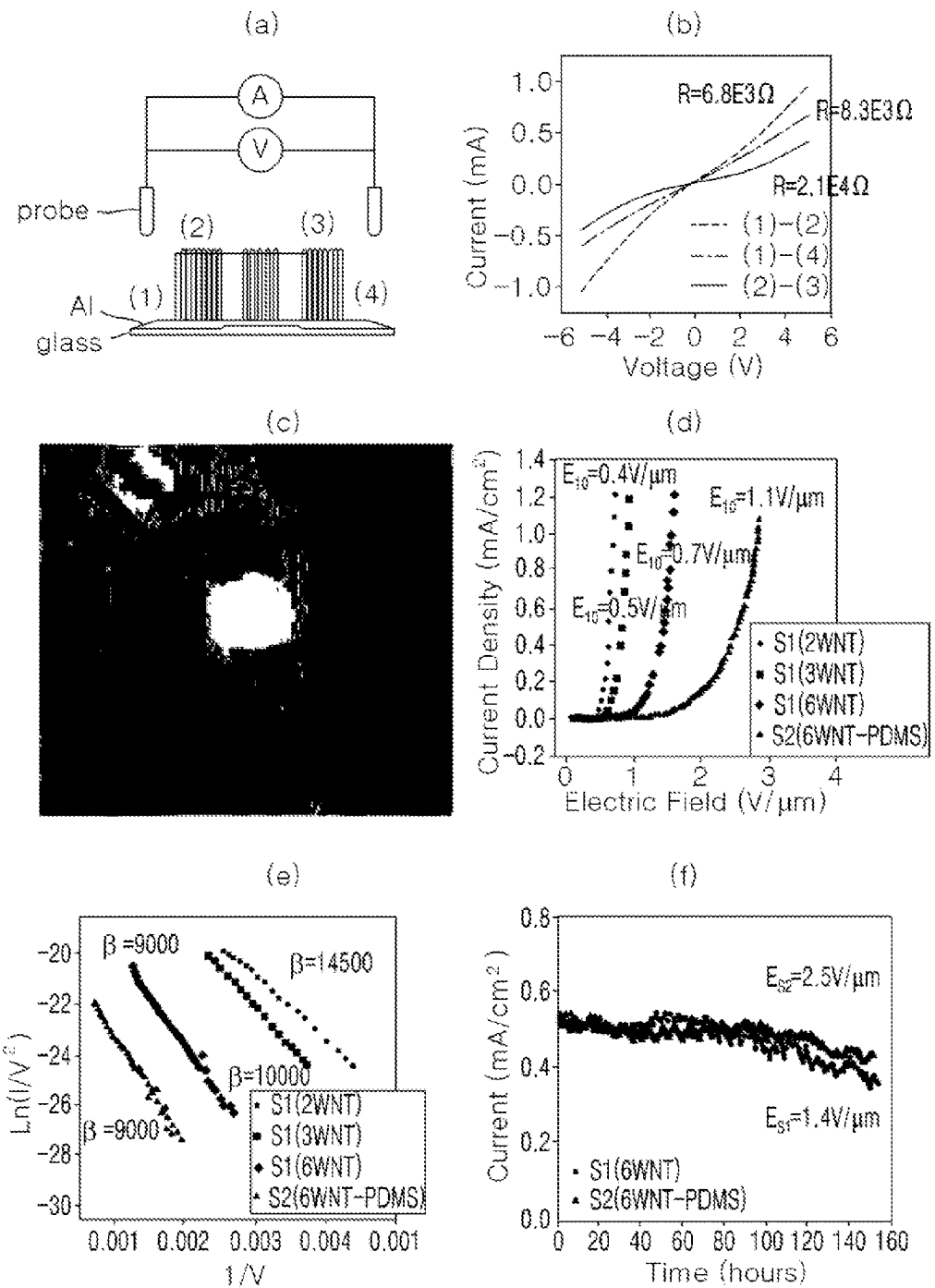
FIG. 4 shows, in portion (a), a schematic view illustrating measuring the electrical properties of the three-dimensional nanostructures S2 having PDMS infiltrated thereto by a two-point probe method; in portion (b), an current-voltage (I-V) graph determined through several current paths; in portion (c), a photograph of a filed emitting device; in portion (d), a current density-electric field graph of the three-dimensional nanostructures; in portion (e), a Fowler-Nordheim plot illustrating the field emission of the three-dimensional nanostructures S1 using double-walled, triple-walled and six-walled carbon nanotubes and that of the three-dimensional nanostructures S2 having PDMS infiltrated thereto and using six-walled carbon nanotubes; and in portion (f), a graph illustrating the long-term reliability in filed emission of the carbon hybrid film.

During the PECVD, the graphene oxide film is reduced and shows a conductivity of about 1800 S/m (Graphs (1)-(4) in portion (b) of FIG. 4). As shown in portion (b) of FIG. 1, the electron diffraction pattern of the multi-layer graphene film is not formed of individual dots but formed of concentric circles. This indicates that the film having multi-layer graphene platelets is randomly oriented.

Portion (c) of FIG. 1 illustrates that the carbon nanotubes have a diameter precisely controlled with the size of the catalyst particles. As reported earlier, a self-assembled block copolymer nanoporous template allows selective control of the number of carbon nanotube walls by adjusting the catalyst particle size to a quasi-nanometer scale (Korean Patent Application No. 2009-0050354 by the present applicant). After adjusting the height of the carbon nanotubes to 10-100 μm (portion (d) of FIG. 1), the completely grown three-dimensional nanostructures are kept intact (S1), or are subjected to spin coating so that poly(dimethyl siloxane) (PDMS) elastomer is infiltrated thereto (S2). The thickness of PDMS is controlled precisely so that the ends of the carbon nanotubes are exposed. Both the resultant hybrid S2 having PDMS infiltrated thereto and the hybrid S1 having no treatment are detached easily from the substrate (portion (e) of FIG. 1). The hybrids are mechanically flexible by virtue of the graphene film, and thus may be transferred to a non-planar or flexible substrate.

Example 2

Mechanical Deformation Test of Three-Dimensional Nanostructures

To evaluate the structural stabilities of the three-dimensional nanostructures S1 and S2 obtained from Example 1, they are subjected to a mechanical deformation test.

Figure 2:
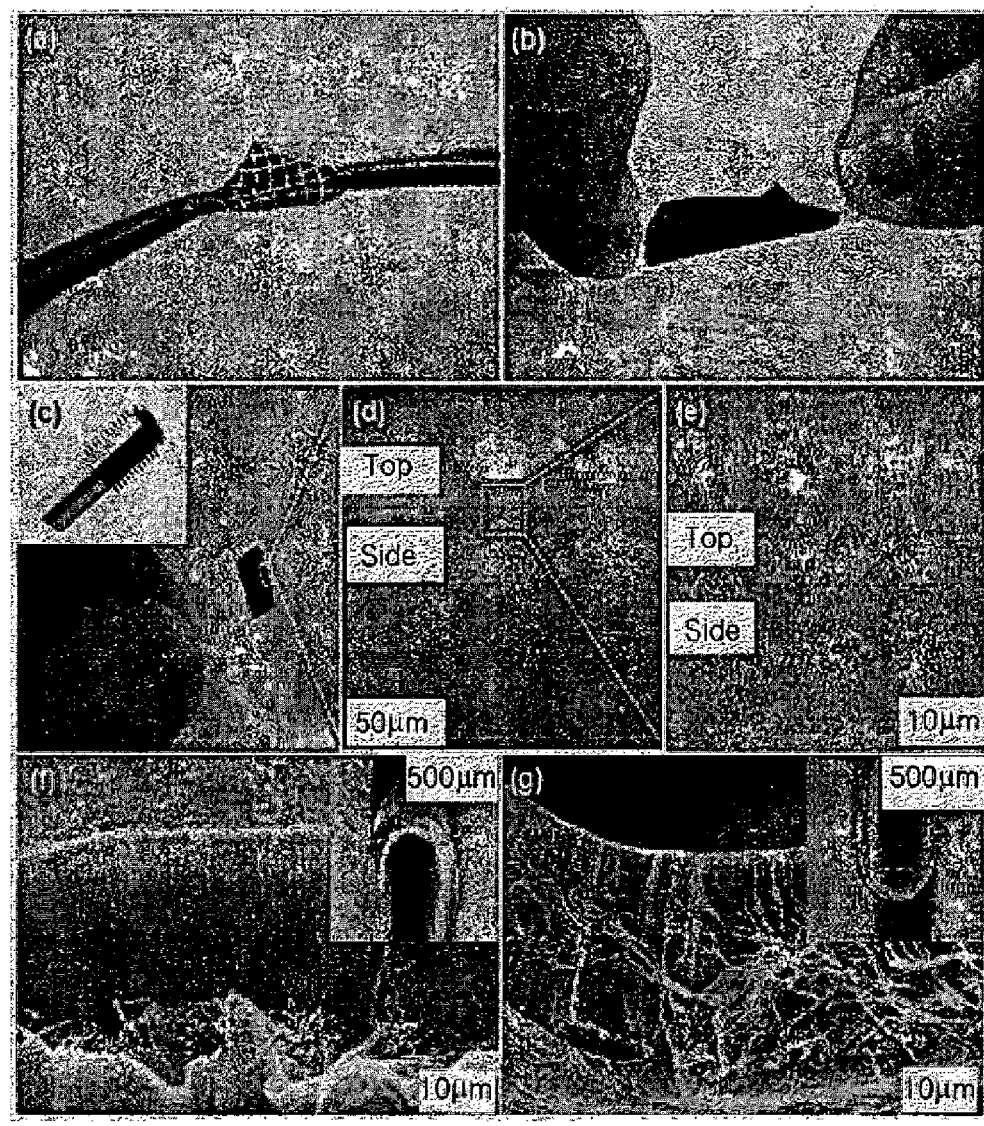
FIG. 2 shows, in portion (a), a photograph illustrating high flexibility and elasticity of S2; in portion (b), a photograph illustrating high flexibility of S1 on a polyethylene terephthalate (PET) film; in portion (c), a photograph of the three-dimensional nanostructures surrounding the edges of a PET film; in portions (d) and (e), SEM images of the film as shown in portion (c); in portion (f), a photograph illustrating the three-dimensional nanostructures bent outwardly on a PET film; and in portion (g), a photograph illustrating the three-dimensional nanostructures bent inwardly on a PET film.

Portion (a) of FIG. 2 illustrates that the three-dimensional nanostructures S2 having PDMS infiltrated thereto are not damaged even when they are stretched or bent. In the case of a pure PDMS film, the PDMS infiltrated film may be repeatedly attached to/detached from a non-planar substrate.

Portion (b) of FIG. 2 shows high deformability of the non-treated three-dimensional nanostructures S1 transferred onto a flexible polyethylene terephthalate (PET) film. Despite of the severe bending of the PET film, the three-dimensional nanostructures are kept undamaged. This indicates that the three-dimensional nanostructures have high mechanical elasticity to allow their rapid deformation into a non-planar structure.

Portion (c) of FIG. 2 illustrates that a thin PET film having a thickness of about 130 μm is surrounded completely with the three-dimensional nanostructures at the edges. As can be seen from the enlarged SEM images of portions (d) and (e) of FIG. 2, the shape of the carbon nanotube forest follows the edges of the PET film with an accurate angle.

Portions (f) and (g) of FIG. 2 illustrate three-dimensional nanostructures bent severely on a PET substrate. The film is adhered well to the PET film even when bent severely outwardly (f) and inwardly (g), while maintaining its structural integrity. When the substrate is released from the strain, the three-dimensional nanostructures return their original planar shapes.

Therefore, it can be seen that the three-dimensional nanostructures obtained from Example 1 maintains their original shape while not being adversely affected by several types of mechanical deformation.

Example 3

Evaluation of Effect of Bending and Stretching on Conductivity

To evaluate quantitatively the effect of bending and stretching on conductivity, a graphene film obtained by growing large-area graphene on a flexible polymer substrate (PDMS substrate) via CVD is subjected to continuous bending and stretching cycles. The electrical resistance of the graphene film and that of the three-dimensional nanostructures S2 having PDMS infiltrated thereto are measured by using a 2635 Sourcemeter (Keithley, USA).

Figure 3:
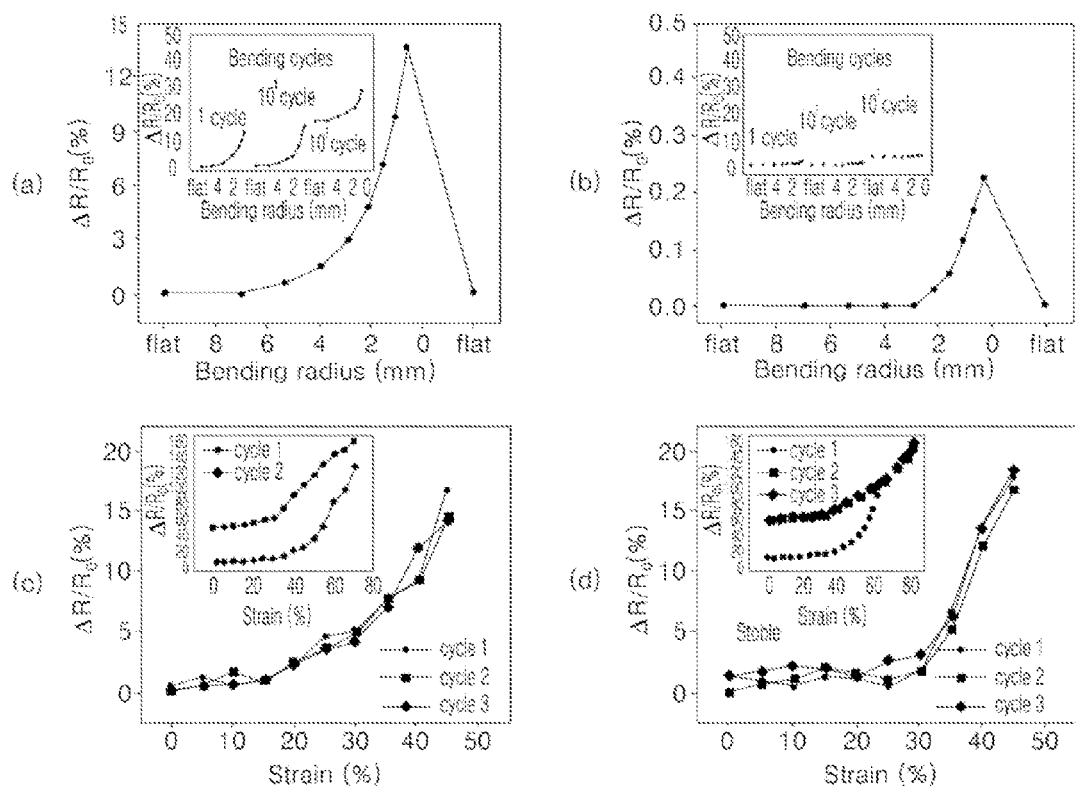
FIG. 3 shows, in portion (a), a graph illustrating variations in resistance as a function of curvature diameter of the three-dimensional nanostructures on a PDMS substrate with a thickness of 50 μm; in portion (b), a graph illustrating variations in resistance as a function of curvature diameter of the three-dimensional nanostructures S2 having PDMS infiltrated thereto (the graph shows the results of the $1^{st}$ cycle, $100^{th}$ cycle and $1000^{th}$ cycle); in portion (c), a graph illustrating variations in resistance of a graphene film on PDMS with a thickness of 50 μm; and in portion (d), a graph illustrating variations in resistance when the three-dimensional nanostructures S2 having PDMS infiltrated thereto are drawn mildly (0-45%) and strongly (0-70%, inset).

Portions (a) and (b) of FIG. 3 show normalized variations in resistance measured while the graphene film (7 nm thickness) on a PDMS substrate and the three-dimensional nanostructures S2 having PDMS infiltrated thereto are subjected to continuous bending cycles. When the curvature diameter of bending is about 6 mm, the graphene film shows an increase in resistance. It is thought that such an increase may result from a relative change in position of each platelet forming the film (portion (a) of FIG. 3). On the contrary, the three-dimensional nanostructures S2 having PDMS infiltrated thereto shows an increase in resistance when the curvature diameter is 3 mm, which is significantly smaller than 6 mm (portion (b) of FIG. 3). Even when the normalized resistance of the three-dimensional nanostructures S2 having PDMS infiltrated thereto reaches the highest value (−0.2%), it is lower than the highest value (−13%) of the graphene film. When the samples are released from bending after a predetermined number of cycles, the graphene film and the PDMS-infiltrated three-dimensional nanostructures recover their original resistance values completely.

Portions (c) and (d) of FIG. 3 show normalized values of resistance when the graphene film and the PDMS-infiltrated three-dimensional nanostructures are subjected to several stretching cycles. The resistance of the graphene film increases when the strain exceeds 15%. However, the resistance of the graphene film returns completely to the initial value upon releasing the stretching, before a threshold appears at about 45% of strain. This may result from sliding of the graphene platelets layered in the film. However, at a stretching ratio of 70%, the resistance value increases sharply and is not recovered even under zero strain. The film is so disintegrated that one may observe the disintegration with the naked eyes (portion (c) of FIG. 3). The PDMS-infiltrated three-dimensional nanostructures may be stretched reversibly by virtue of the high elongation of the graphene film even under a strain of about 45% (portion (d) of FIG. 3).

Therefore, it can be seen that the three-dimensional nanostructures obtained from Example 1 recover their electrical resistance when they are subjected to bending or stretching and then released therefrom.

Example 4

Determining Electrical Contacts between Carbon Nanotubes and Graphene Film

The electrical contacts between the carbon nanotube forest of the PDMS-infiltrated three-dimensional nanostructures S2 obtained from Example 1 and the graphene film are determined by using a 2635 Sourcemeter (Keithley, USA).

Portion (a) of FIG. 4 is a graph illustrating the electrical properties determined by a two-point probe, and portion (b) of FIG. 4 is an I-V curve obtained thereby. Since each carbon nanotube forest takes a rectangular shape, each forms an independent contact. The I-V curve is plotted through the carbon nanotube forest, iron catalyst and graphene film (red curve), and through the carbon nanotube forest/iron catalyst/graphene film/iron catalyst/carbon nanotube forest (green curve). It can be seen that the two I-V curves show a typical ohmic response. The nitrogen-doped carbon nanotube forest shows an ohmic response and has a work function of 4.27 eV.

The multi-layer graphene film also shows a typical ohmic response (blue curve) and has a work function of 4.37 eV. It is known that iron has a work function of 4.5 eV. Therefore, the overall system includes elements with ohmic conduction having a work function of 4.2-4.5 eV.

As a result, all electrical contacts have ohmic characteristics with no particular hindrance.

Portion (c) of FIG. 4 is a photograph of a field emission device. A carbon hybrid film floating on the surface of water may be transferred easily to a conductive substrate and incorporated to a filed emission device. The field emission characteristics of the hybrid film at room temperature are determined while varying the number of carbon nanotube walls (Epion, Korea). All of the films have a uniform length of 40 μm. Since stable electrical contacts to the underlying device substrate are realized through the graphene film and the carbon nanotubes have a uniform length and diameter, uniform emission occurs over the whole regions of the film.

Portion (d) of FIG. 4 is a graph illustrating variations in current density as a function of electrical field applied to the film. It can be seen that as the number of carbon nanotube walls decreases, the nanotubes have sharper tips and lower turn-on field (as determined at a current density of 10 μAmps). A typical voltage of double-walled carbon nanotubes is as low as 0.4 V/μm, which falls within a lower range of the values that may be obtained by field emission of carbon nanotubes. The PDMS-infiltrated three-dimensional nanostructures show an increase in turn-on field, because the number of the carbon nanotube tips exposed to the upper surface is limited. The field emission of the uniform carbon nanotube tips of the three-dimensional nanostructures is fitted to electric field strength according to the Fowler-Nordeheim equation over a broad range of voltages. After calculation, the field-enhancement factor β is shown to be 9000-14500. The result is sufficient for the three-dimensional nanostructures to be used in field emission display applications (portion (e) of FIG. 4).

As shown in portion (f) of FIG. 4, the six-walled carbon nanotube three-dimensional nanostructures S1 and the six-walled carbon nanotube/PDMS-infiltrated three-dimensional nanostructures S2 show high reliability in emission current during the continuous operation for more than 1 week.

The three-dimensional nanostructures disclosed herein are based on hybridization of one-dimensional nanomaterials with two-dimensional graphene, and thus realize a synergic effect therefrom. In addition, the three-dimensional nanostructures have excellent flexibility and elasticity, are transferred easily to any substrates including non-planar surfaces, and realize ohmic electrical contacts at all contacts of the three-dimensional nanostructures composed of the nanomaterials, metallic catalyst and graphene film so that they are incorporated easily to field emitting devices.

While the present invention has been described with respect to the specific embodiments, it will be apparent to those skilled in the art that various changes and modifications may be made without departing from the spirit and scope of the invention as defined in the following claims.

What is claimed is:

1. Three-dimensional nanostructures comprising:
a graphene film;
a metallic catalyst on the graphene film; and
one or more nanomaterials grown on the graphene film, with the metallic catalyst being disposed between the nanomaterials and the graphene film,
wherein:
the nanomaterials are selected from nanotubes, nanowires, nanorods and nanoneedles; and the nanomaterials are aligned vertically to the graphene film.

2. The three-dimensional nanostructures according to claim 1, wherein the graphene film is a mono-layer or multi-layer graphene plate or a film obtained by reducing a mono-layer or multi-layer graphene oxide plate.

3. The three-dimensional nanostructures according to claim 1, wherein the metal is selected from the group consisting of iron, nickel, copper, gold, platinum, palladium, cobalt and a combination thereof.

4. The three-dimensional nanostructures according to claim 1, which further comprise polydimethylsiloxane (PDMS) elastomer infiltrated thereto.

5. The three-dimensional nanostructures according to claim 1, which has electrical contacts realized by ohmic electrical contacts.

* * * * *